United States Patent
Siemieniec et al.

(10) Patent No.: US 9,812,563 B2
(45) Date of Patent: Nov. 7, 2017

(54) TRANSISTOR WITH FIELD ELECTRODES AND IMPROVED AVALANCHE BREAKDOWN BEHAVIOR

(71) Applicant: Infineon Technologies AG, Neubiberg (DE)

(72) Inventors: Ralf Siemieniec, Villach (AT); Markus Zundel, Egmating (DE); Karl-Heinz Bach, Groebenzell (DE); Franz Hirler, Isen (DE); Christian Kampen, Munich (DE); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/182,244

(22) Filed: Jun. 14, 2016

(65) Prior Publication Data
US 2016/0365441 A1    Dec. 15, 2016

(30) Foreign Application Priority Data
Jun. 15, 2015    (DE) .................. 10 2015 109 545

(51) Int. Cl.
*H01L 29/78*    (2006.01)
*H01L 29/06*    (2006.01)
(Continued)

(52) U.S. Cl.
CPC ........ *H01L 29/7813* (2013.01); *H01L 21/265* (2013.01); *H01L 21/2652* (2013.01);
(Continued)

(58) Field of Classification Search
CPC ............... H01L 29/7813; H01L 29/063; H01L 29/0696; H01L 29/1095; H01L 29/407;
(Continued)

(56) References Cited

U.S. PATENT DOCUMENTS 7,465,987 B2 * 12/2008  Krumrey ............... H01L 29/407
                                                         257/330
7,923,772 B2 *  4/2011  Mauder ............... H01L 29/1095
                                                         257/330
(Continued)

FOREIGN PATENT DOCUMENTS

DE           10207309 A1    9/2003
DE       102008050298 A1    4/2009

*Primary Examiner* — Ida M Soward
(74) *Attorney, Agent, or Firm* — Murphy, Bilak & Homiller, PLLC

(57) ABSTRACT

A transistor cell includes, in a semiconductor body, a drift region of a first doping type, a source region of the first doping type, a body region of a second doping type, and a drain region of the first doping type. The body region is arranged between the source and drift regions. The drift region is arranged between the body and drain regions. A gate electrode is adjacent the body region and dielectrically insulated from the body region by a gate dielectric, and a field electrode is dielectrically insulated from the drift region by a field electrode dielectric. The drift region includes an avalanche region having a higher doping concentration than sections of the drift region adjacent the avalanche region and which is spaced apart from the field electrode dielectric in a direction perpendicular to the current flow direction. The field electrode is arranged in a needle-shaped trench.

21 Claims, 10 Drawing Sheets

(51) Int. Cl.
*H01L 29/40* (2006.01)
*H01L 29/66* (2006.01)
*H01L 29/10* (2006.01)
*H01L 21/265* (2006.01)
*H01L 21/324* (2006.01)

(52) U.S. Cl.
CPC ........ *H01L 29/063* (2013.01); *H01L 29/0696* (2013.01); *H01L 29/1095* (2013.01); *H01L 29/407* (2013.01); *H01L 29/408* (2013.01); *H01L 29/66734* (2013.01); *H01L 21/324* (2013.01)

(58) Field of Classification Search
CPC ............ H01L 29/408; H01L 29/66734; H01L 29/402; H01L 29/404
See application file for complete search history.

(56) References Cited

U.S. PATENT DOCUMENTS

| | | | | |
|---|---|---|---|---|
| 8,058,670 B2* | 11/2011 | Hshieh | ................ | H01L 29/0619 257/136 |
| 8,354,711 B2* | 1/2013 | Zeng | ................ | H01L 29/0623 257/330 |
| 9,219,149 B2* | 12/2015 | Mauder | ............... | H01L 29/7827 |
| 9,257,549 B2* | 2/2016 | Hirler | ................ | H01L 29/0834 |
| 9,356,134 B2* | 5/2016 | Hebert | ................ | H01L 29/7813 |
| 9,391,149 B2* | 7/2016 | Weber | ................... | H01L 29/404 |
| 9,443,973 B2* | 9/2016 | Jin | ...................... | H01L 21/2652 |
| 2003/0173618 A1* | 9/2003 | Zundel | ................ | H01L 29/0878 257/329 |
| 2009/0114986 A1* | 5/2009 | Hirler | .................. | H01L 29/404 257/334 |
| 2012/0032258 A1* | 2/2012 | Zeng | ................... | H01L 29/0634 257/330 |
| 2012/0319761 A1* | 12/2012 | Zundel | .................. | H01L 29/402 327/530 |
| 2013/0240987 A1* | 9/2013 | Hirler | ................ | H01L 29/0834 257/331 |
| 2014/0054684 A1* | 2/2014 | Darwish | ............... | H01L 29/167 257/330 |
| 2014/0159149 A1* | 6/2014 | Hsieh | .................. | H01L 29/7813 257/331 |
| 2014/0183625 A1* | 7/2014 | Darwish | ............. | H01L 29/0649 257/330 |
| 2014/0197487 A1* | 7/2014 | Cascino | ............ | H01L 29/41766 257/337 |
| 2015/0303298 A1* | 10/2015 | Schulze | .................. | H01L 29/32 257/329 |
| 2016/0064497 A1* | 3/2016 | Darwish | ............. | H01L 29/7823 327/434 |
| 2016/0197176 A1* | 7/2016 | Stefanov | ............... | H01L 29/404 257/334 |
| 2017/0040447 A1* | 2/2017 | Deng | ................... | H01L 29/063 |

* cited by examiner

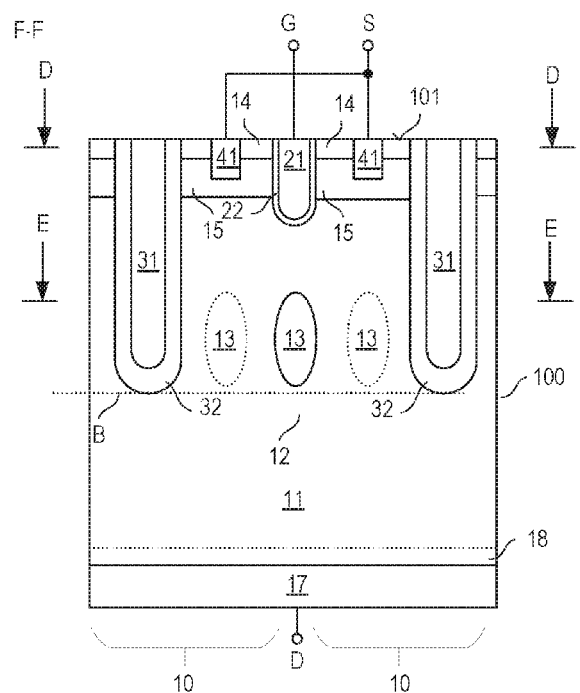
FIG 14
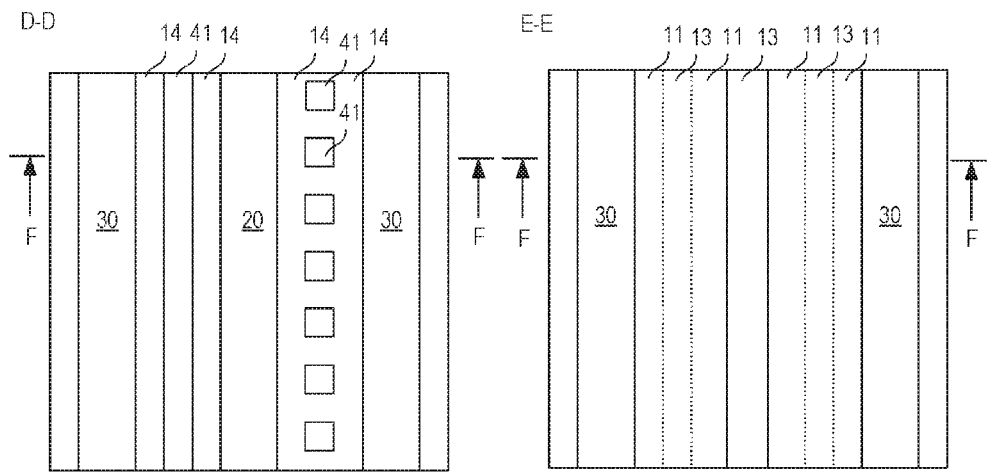
FIG 15
FIG 16

US 9,812,563 B2

TRANSISTOR WITH FIELD ELECTRODES AND IMPROVED AVALANCHE BREAKDOWN BEHAVIOR

TECHNICAL FIELD

This disclosure in general relates to a transistor device, in particular a MOSFET (Metal Oxide Semiconductor Field-Effect Transistor).

BACKGROUND

Transistors, such as MOSFETs, are widely used in automotive, industrial, or consumer electronic applications for driving loads, converting power, or the like. Those transistors, which are often referred to as power transistors, are available with different voltage blocking capabilities. The "voltage blocking capability" defines the maximum voltage level the transistor can withstand in an off-state (when switched off). When, in the off-state, a voltage with a level higher than this maximum voltage level is applied to the transistor an avalanche breakthrough may occur at an internal pn-junction of the transistor.

It is desirable to design a transistor, in particular a MOSFET, such that it can withstand an avalanche breakthrough repetitively without being destroyed or without being subject to degradation effects such as, for example, a reduction of the voltage blocking capability.

SUMMARY

One embodiment relates to a transistor device. The transistor device includes at least one transistor cell that includes, in a semiconductor body, a drift region of a first doping type, a source region of a first doping type, a body region of a second doping type, and a drain region of the first doping type, wherein the body region is arranged between the source region and the drift region, and wherein the drift region is arranged between the body region and the drain region; a gate electrode adjacent the body region and dielectrically insulated from the body region by a gate dielectric; and a field electrode dielectrically insulated from the drift region by a field electrode dielectric. The drift region includes an avalanche region, wherein the avalanche region has a higher doping concentration than sections of the drift region adjacent the avalanche region and is spaced apart from the field electrode dielectric in a direction perpendicular to a current flow direction of the transistor device. The field electrode is arranged in a trench having a bottom in a bottom plane of the semiconductor body, and the avalanche region includes at least one section that is closer to the bottom plane than to a surface of the semiconductor body defined by the source region.

One embodiment relates to a method for forming a transistor device having at least one transistor cell. The method includes forming in a semiconductor body in a drift region of the transistor cell an avalanche region that has a higher doping concentration than sections of the drift region adjacent the avalanche region. Forming the avalanche region includes forming the avalanche region such that the avalanche region is spaced apart, in a direction perpendicular to a current flow direction, from a field electrode dielectric dielectrically insulating a field electrode from the drift region and, in the current flow direction, from a pn junction between a body region and the drift region, and that the avalanche region includes at least one section that is closer to a bottom plane than to a surface of the semiconductor body, whereas the field electrode is arranged in a trench having a bottom in the bottom plane.

Another embodiment relates to a transistor device. The transistor device includes at least one transistor cell that includes, in a semiconductor body, a drift region of a first doping type, a source region of a first doping type, a body region of a second doping type, and a drain region of the first doping type, wherein the body region is arranged between the source region and the drift region, and wherein the drift region is arranged between the body region and the drain region; a gate electrode adjacent the body region and dielectrically insulated from the body region by a gate dielectric; and a field electrode dielectrically insulated from the drift region by a field electrode dielectric. The drift region includes an avalanche region, wherein the avalanche region has a higher doping concentration than sections of the drift region adjacent the avalanche region and is spaced apart from the field electrode dielectric in a direction perpendicular to a current flow direction of the transistor device. The field electrode is arranged in a needle shaped trench.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

FIG. 14 shows a vertical cross sectional view of a transistor device according to another embodiment;

FIG. 15 shows a horizontal cross sectional view in a first section plane of a transistor device of the type shown in FIG. 14, according to one embodiment;

FIG. 16 shows a horizontal cross sectional view in a second section plane of a transistor device of the type shown in FIG. 14, according to one embodiment;

DETAILED DESCRIPTION

In the following detailed description, reference is made to the accompanying drawings. The drawings form a part of the description and by way of illustration show specific embodiments of how the invention may be practiced. It is to be understood that the features of the various embodiments described herein may be combined with each other, unless specifically noted otherwise.

Figure 1:
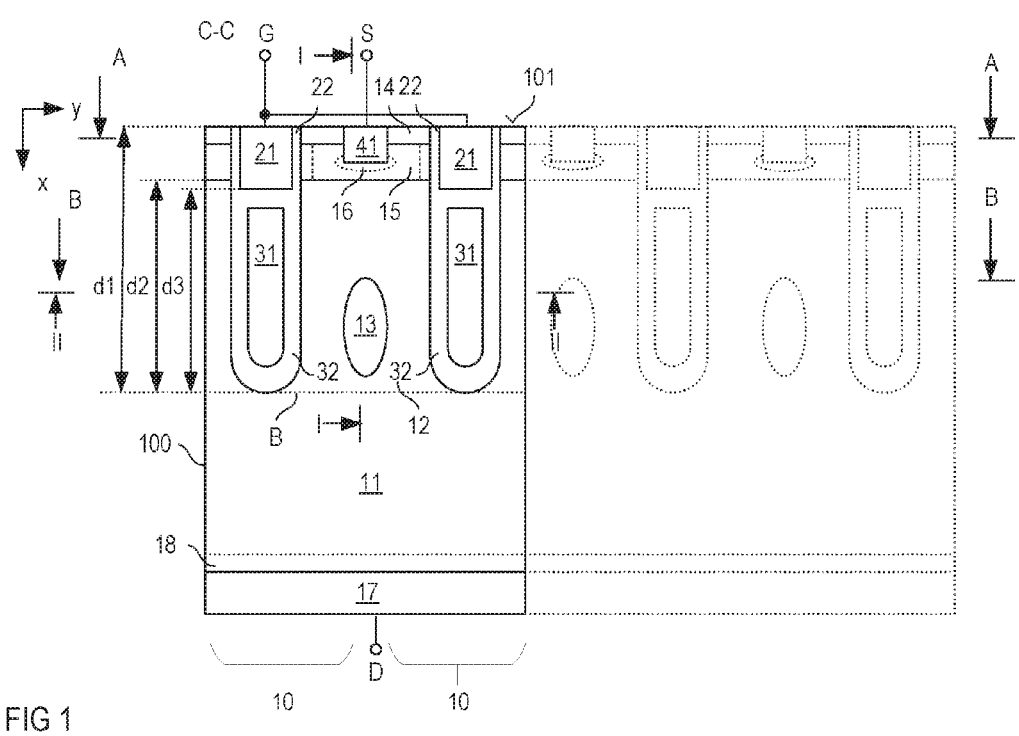
FIG. 1 shows a vertical cross sectional view of a transistor device according to one embodiment.

FIG. 1 shows a vertical cross sectional view of a transistor device according to one embodiment. The transistor device includes at least one transistor cell 10, whereas in FIG. 1 two transistor cells are shown. However, as illustrated in dotted lines, the transistor device may include a plurality of transistor cells, such as up to several thousand or even several million transistor cells.

Referring to FIG. 1, the at least one transistor cell 10 includes, in a semiconductor body 100, a drift region 11 of a first doping type, a source region 14 of a first doping type, a body region 15 of a second doping type, and a drain region 17 of the first doping type. The body region 15 is arranged between the source region 14 and the drift region 11, and the drift region 11 is arranged between the body region 15 and the drain region 17.

The source region 14 and the drain region 17 are spaced apart in a current flow direction of the transistor device. In the embodiment shown in FIG. 1, the current flow direction is a vertical direction x of the semiconductor body 100. The "vertical direction" x is a direction perpendicular to a first surface 101 of the semiconductor body 100. However, the principles explained below are not restricted to be used in a transistor device where the current flow direction is a vertical direction of the semiconductor body, such transistor device is commonly referred to as vertical transistor device. Moreover, the principles explained below are also applicable to a lateral transistor device where the source region and the drain region are spaced apart in a lateral direction, which is a direction parallel to a surface of the semiconductor body.

According to one embodiment, the source region 14 adjoins the body region 15, and the body region 15 adjoins the drift region 11. As the body region 15 and the drift region 11 have complementary doping types, there is a pn-junction between the body region 15 and the drift region 11. In the embodiment shown in FIG. 1, the drain region 17 adjoins the drift region 11. However, this is only an example. According to another embodiment a field-stop region (shown in dotted lines in FIG. 1) of the same doping type as the drain 17 and the drift region 11, but more highly doped than the drift region 11, is arranged between the drift region 11 and the drain region 17.

The semiconductor body 100 may include a conventional semiconductor material such as, for example, silicon (Si), silicon carbide (SiC), gallium arsenide (GaAs), gallium nitride (GaN), or the like. If the semiconductor body 100 is comprised of silicon, the doping concentrations of the individual device regions may be as follows. For example, in a transistor device with a semiconductor body 100 made of Si, the doping concentration of the drift region 11 is selected from a range of between $1E14$ cm$^{-3}$ and $1E17$ cm$^{-3}$, the doping concentration of the source region 14 is selected from a range of between $1E19$ cm$^{-3}$ and $1E21$ cm$^{-3}$, the doping concentration of the drain region 17 is selected from a range of between $1E19$ cm$^{-3}$ and $1E21$ cm$^{-3}$, and the doping concentration of the body region 15 is selected from a range of between $1E15$ cm$^{-3}$ and $1E18$ cm$^{-3}$.

Referring to FIG. 1, the at least one transistor cell 10 further includes at least one gate electrode 21. The gate electrode 21 is adjacent the body region 15 and is dielectrically insulated from the body region 15 by a gate dielectric 22. In a current flow direction of the transistor device, which is the vertical direction x in the embodiment shown in FIG. 1, the gate electrode 21 extends from the source region 14 through the body region 15 to the drift region 11 so that it can control a conducting channel in the body region 15 along the gate dielectric 22 between the source region 14 and the drift region 11. In the embodiment shown in FIG. 1, the gate electrode 21 is a trench electrode. That is, the gate electrode 21 is arranged in a trench that extends from the first surface 101 in the vertical direction x of the semiconductor body 100. The gate electrode 21 may include a conventional gate electrode material. Examples of the gate electrode material include, but are not restricted to, a metal, a silicide, and a highly doped polycrystalline semiconductor material, such as polysilicon. The gate dielectric 22 may include a conventional gate dielectric material. Examples of the gate dielectric material include, but are not restricted to, an oxide, a nitride, and combinations of an oxide and a nitride.

Referring to FIG. 1, the at least one transistor cell 10 further includes a field electrode 31 adjacent the drift region 11 and dielectrically insulated from the drift region 11 by a field electrode dielectric 32. Referring to FIG. 1, the field electrode 31 may be implemented as a trench electrode which, in the current flow direction (the vertical direction x in the embodiment shown in FIG. 1), may have a length that is at least 50%, at least 70%, or at least 90% of a length of the drift region 11 in the current flow direction. The length of the drift region 11 is the distance between the body region 15 and the drain region 17 (or the optional field-stop region) in the current flow direction, which is the vertical direction x in the embodiment shown in FIG. 1. The length of the drift region 11 is, inter alia, dependent on a desired voltage blocking capability of the transistor device. Dependent on the desired application, the transistor device can be designed to have a voltage blocking capability selected from a range of between 12V and 400V. The field electrode 31 may include a conventional field electrode material. Examples of the field electrode material include, but are not restricted to, a metal, a silicide, and a highly doped polycrystalline semiconductor material, such as polysilicon. The field electrode dielectric may include a conventional field electrode dielectric material. Examples of the field electrode dielectric material include, but are not restricted to, an oxide, a nitride, and combinations of an oxide and a nitride.

In the embodiment shown in FIG. 1, the gate electrode 21 and the field electrode 31 are located in a common trench extending from the first surface 101 into the semiconductor body 101. This, however, is only an example. It is also possible to implement the gate electrode 21 and the field electrode 31 in separate trenches. Examples of this are explained with reference to FIGS. 14-24 herein below.

The transistor device further includes a source electrode 41 electrically connected to the source region 14. The source electrode 41 is electrically coupled to a source node S of the transistor device, the drain region 17 is electrically coupled to a drain node D, and the gate electrode 21 is electrically coupled to a gate node G. These source, drain, and gate nodes S, D, G are only schematically illustrated in FIG. 1. The field electrode 31 is either electrically connected to the source node S or the gate node G. However, a connection between the field electrode 32 and one of the source and gate nodes S, G is not shown in FIG. 1.

In a transistor device that includes a plurality of transistor cells 10, the individual transistor cells 10 are connected in parallel by having the gate electrodes 21 connected to the gate node, and by having the source regions 14 connected to the source node S. The plurality of transistor cells may have the drift region 11 and the drain region 17 in common. Furthermore, two or more transistor cells may share one field electrode 31 and one gate electrode 21 and/or two or more transistor cells may share one source electrode 41 and one body region 15.

According to one embodiment, the source electrode 41 in the at least one transistor cell 10 is further connected to the body region 15. In the embodiment shown in FIG. 1 this is achieved by the source electrode 41 extending from the first surface 101 of the semiconductor body 100 through the source region 14 into the body region 15. In this case, the source electrode 41 is connected to the source region 14 along sidewalls of a trench in which it is arranged, and is connected to the body region 15 at least along a bottom of the trench. Optionally, there is a connection region 16 of the second doping type that electrically connects the body region 15 to the source electrode 41. This connection region 16 has a higher doping concentration than the body region 15 and provides for an ohmic contact between the source electrode 41 and the body region 15.

The transistor device can be implemented as an n-type transistor device or a p-type transistor device. In the first case, the first doping type (the doping type of the drift region 11, the source region 14 and the drain region 17) is an n-type, and the second doping type (the doping type of the body region 15 and the connection region 16) is a p-type. In the second case, the first doping type is a p-type and the second doping type is an n-type. Furthermore, the transistor device can be implemented as an enhancement device or a depletion device. In an enhancement device, the body region 15 of the second doping type adjoins the gate dielectric 22. In a depletion device, there is a channel region (shown in dashed lines in FIG. 1) of the first doping type between the gate dielectric 22 and the body region 15.

The transistor device can be operated like a conventional transistor device. That is, the transistor device can be switched on and off by applying a suitable drive potential to the gate electrode G. The transistor device is in an on-state when the drive potential applied to the gate electrode G is such that there is a conducting channel in the body region 15 along the gate dielectric between the source region 14 and the drift region 11, and the transistor device is in the off-state, when the drive potential applied to the gate node G is such that the conducting channel in the body region 15 between the source region 14 and the drift region 11 is interrupted. In the off-state, a space charge region (depletion region) may expand in the drift region 11 beginning at the pn-junction between the body region 15 and the drift region 11. For example, in an n-type transistor device, a space charge region expands in the drift region 11 when a positive voltage is applied between the drain node D and the source node S and when the transistor device is in the off-state. This space charge region is associated with ionized dopant atoms in the drift region 11 (in an n-type drift region 11, those ionized dopant atoms are positively charged). Counter charges to those ionized dopant atoms in the drift region 11 are provided by the body region 15 and by the field electrode 31. An avalanche breakdown at the pn-junction between the body region 15 and the drift region 11 may occur when the voltage applied between the drain node D and the source node S is such that a magnitude of an electrical field at the pn-junction reaches a critical level (often referred to as critical electrical field $E_{crit}$). The voltage level of the voltage between the drain node D and the source node S at which such avalanche breakdown may occur is, inter alia, dependent on a doping concentration of the drift region 11, a length of the drift region 11 in the current flow direction (the vertical direction x), the specific implementation of the field electrode 31, etc.

It is highly undesirable for an avalanche breakdown to occur at the field electrode dielectrics 32. An avalanche breakdown is associated with charge carriers flowing through the drift region 11. Those charge carriers, which are also referred to as hot charge carriers, may end up in the field electrode dielectric 32 there they may accumulate and remain permanently. Those charge carriers remaining in the field electrode dielectric 32 may negatively influence the switching behavior of the transistor device. In particular, those charge carriers may increase the on-resistance of the transistor device in the on-state. The on-resistance is the electrical resistance of the transistor device between the source node S and the drain node D when the transistor device is in the on-state.

In order to prevent an avalanche breakdown from occurring at the gate dielectric 32 the at least one transistor cell 10, in the drift region 11, includes an avalanche region 13. The avalanche region 13 has a higher doping concentration than sections of the drift region 11 adjacent the avalanche region 13 and is spaced apart from the field electrode dielectric in a direction perpendicular to a current flow direction of the transistor device. Furthermore, the avalanche region 13 is spaced apart from a pn junction between the body region and the drift region in the current flow direction of the transistor device. Referring to FIG. 1, one avalanche region 13 may be located in a semiconductor mesa region between the field electrode dielectrics 32 of two neighboring transistor cell so that one avalanche region may be shared by two transistor cells.

The avalanche region 13 defines a local maximum of the doping concentration in the drift region 13 and, therefore, defines a region where the voltage blocking capability of the transistor device is locally decreased. When the transistor device is in the off-state and a voltage that reverse biases the pn junction between the body region 15 and the drift region 11 is applied between the drain node D and the source node S, and when a voltage level of this voltage increases, an avalanche breakdown occurs at the avalanche region 13 before an avalanche breakdown may occur at any other position in the drift region 11. As the avalanche region 13 is spaced apart from the field electrode dielectric 32 the avalanche breakdown occurs distant to the field electrode dielectric 31 so that there is no risk of hot charge carriers associated with the avalanche breakdown being injected into the field electrode dielectric 32.

In a conventional transistor device, that is, a transistor device of the type shown in FIG. 1 with the avalanche region being omitted, an avalanche breakdown usually occurs in a region close to the bottom of the trenches in which the field electrodes 31 are arranged. In FIG. 1, the dotted line B represents a plane (a horizontal plane) of the drift region 11 where the bottoms of those trenches are located. This plane will be referred to as bottom plane in the following. According to one embodiment, in the transistor device shown in FIG. 1, at least one section of the avalanche region 13 is arranged closer to the bottom plane B than to the first surface 101 to surely prevent an avalanche breakdown from occurring in the region of the trench bottoms. According to another embodiment, in the transistor device shown in FIG. 1, at least one section of the avalanche region 13 is arranged closer to the bottom plane B than to the pn junction (between the drift region 11 and the body region 15), to surely prevent an avalanche breakdown from occurring in the region of the trench bottoms. That is, a section of the avalanche region 13 facing the drain region 17 is closer to the bottom plane B than to the first surface 101 or the pn junction. Let d1 be a (shortest) first distance between the bottom plane B and the first surface 101, and let d2 be a (shortest) second distance between the bottom plane B and the pn junction. Having a section of the avalanche region 13 facing the drain region 17 being closer to the bottom plane B than to the first surface 101 is equivalent to a distance between this section and the bottom plane B being less than 50% of the first distance d1, and having a section of the avalanche region 13 facing the drain region 17 being closer to the bottom plane B than to the pn junction is equivalent to a distance between this section and the bottom plane B being less than 50% of the second distance d2.

According to one embodiment, the avalanche region 13 includes at least one section that is spaced apart from the bottom plane less than 30% of the first distance d1, less than 20%, or even less than 10% of the first distance d1. According to one embodiment, the avalanche region 13 includes at least one section that is spaced apart from the bottom plane less than 30% of the second distance d2, less than 20%, or even less than 10% of the second distance d2.

According to one embodiment, the complete avalanche region 13 is closer to the bottom plane B than to the first surface 101 or the pn junction, respectively. That is, each section of the avalanche region 13 is closer to the bottom plane B than to the first surface 101 or the pn junction, respectively. That is, a shortest distance between each section of the avalanche region 13 and the bottom plane B is less than 50% of the distance d1 between the bottom plane B and the first surface or the distance d2 between the bottom plane B and the pn junction, respectively. According to one embodiment, a shortest distance between each section of the avalanche region 13 and the bottom plane B is less than 30% of d1 (or d2), less than 20% of d1 (or d2), or even less than 10% of d1 (or d2). According to another embodiment, a (shortest) distance between at least one section of the avalanche region 13 and the bottom region B is less than 50%, less than 30%, less than 20%, or even less than 10% of a (shortest) third distance d3, which is a distance between the bottom plane B and the gate electrode 21. According to another embodiment, a (shortest) distance between each section of the avalanche region 13 and the bottom region B is less than 50%, less than 30%, less than 20%, or even less than 10% of d3.

According to another embodiment, the avalanche region 13, in the current flow direction, extends into the bottom plane B. That is, in a device of the type shown in FIG. 1, the avalanche region 13 includes a section that is below the bottom plane.

In the embodiment shown in FIG. 1, the surface 101 of the semiconductor body 100 is drawn as a horizontal region of the semiconductor body 100 between the source electrode 41 and the gate dielectric 22. However, this is only an example. The source region 14 may narrow towards the first surface 101 so that, in an extreme case, the surface 101 can have a very small size.

Figure 2A:
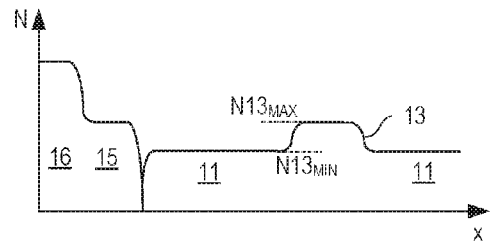
FIGS. 2A-2B show graphs that illustrate doping concentrations in an avalanche region and surrounding regions in the transistor device shown in FIG. 1.
Figure 2B:
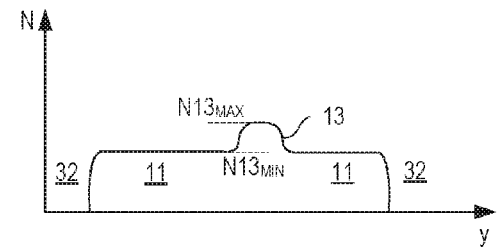

FIG. 2A shows the doping concentration along a line I-I extending in the current flow direction (vertical direction) x and going through the connection region 16, the body region 15 and the avalanche region 13. FIG. 2B shows the doping concentration along a line II-II extending in a direction y perpendicular to the current flow direction, which is a lateral direction of the semiconductor body 100 in this embodiment. As can be seen from FIGS. 2A and 2B, the avalanche region 13, in the current flow direction as well as perpendicular to the current flow direction, defines a local maximum of the doping concentration in the drift region 11. In particular, the avalanche region 13 defines a local maximum of the doping concentration in a mesa region 12 of the drift region 11. The mesa region 12 is a region between the field electrode dielectrics 32 of neighboring field electrodes 31 and the pn junction and, in the current flow direction, does not extend beyond bottoms of the trenches accommodating the field electrodes.

In FIGS. 2A and 2B, $N13_{MAX}$ denotes the maximum doping concentration of the drift region 11 in the avalanche region 13, and $N13_{MIN}$ denotes the doping concentration of those sections of the drift region 11 adjacent the avalanche region 13. According to one embodiment, the doping concentration increases monotonically from the concentration $N13_{MIN}$ in a region adjacent the avalanche region 13 to the maximum concentration $N13_{MAX}$ in the avalanche region 13. According to one embodiment, a ratio between the maximum doping concentration $N13_{MAX}$ and the doping concentration $N13_{MIN}$ in the drift region 11 adjacent the avalanche region 13 is between 2 and 10, in particular between 3 and 7.

As explained above, the avalanche region 13 defines a local maximum of the doping concentration in the drift region. For physical reasons and as can be seen from FIGS. 2A-2B the doping concentration between such maximum $N13_{MAX}$ and the doping concentration $N13_{MIN}$ of regions surrounding the avalanche region 13 cannot change abruptly. For the purpose of explanation and, in particular, when it comes to distances between the avalanche region 13 and other structures in the device such as the first surface 101, the pn junction, or the field electrode dielectric, to name only a few, it is assumed that doped regions included in the avalanche region 13 are those regions with a doping concentration of at least 50% of the maximum concentration $N13_{MAX}$.

Referring to the above, the avalanche region 13 is spaced apart from the field electrode dielectric 32. The field electrode dielectric 32 has thickness, which is the (shortest) distance between the field electrode 31 and the drift region 32. According to one embodiment, a distance between the avalanche region 13 and the field electrode dielectric is at least 50% of the thickness of the field electrode dielectric. According to another embodiment, the distance is at least 50 nanometers (nm), at least 100 nm or even at least 200 nm. According to one embodiment, and as explained above, this distance is measured between the field electrode dielectric 32 and a section of the avalanche region where a doping concentration of the avalanche region 13 is at least 50% of the maximum doping concentration $N13_{MAX}$.

Figure 3:
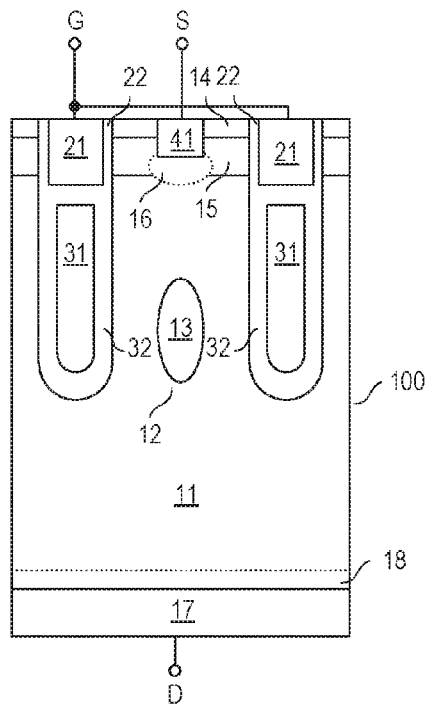
FIG. 3 shows a modification of the transistor device shown in FIG. 1.

FIG. 3 shows a modification of the transistor device shown in FIG. 1. In the transistor device shown in FIG. 3, the connection region 16, which electrically connects the body region 15 to the source electrode 41, extends from the source electrode 41 through the body region 15 into the drift region 11. In this embodiment, the flux lines of the electric field concentrate in the middle of the mesa region 12.

Referring to the above, the field electrode 31 may be connected to the gate node G. This can be obtained by electrically connecting the field electrode 31 to the gate node G or the gate electrode 21, respectively, in a region of the transistor device not shown in FIGS. 1 and 3. According to another embodiment, shown in FIG. 4, the gate electrode 21 and the field electrode 31 are formed by one trench electrode. A section of this trench electrode adjacent the body region 15 and dielectrically insulated from the body region 15 by the gate dielectric 22 forms the gate electrode 21, and a section of this trench electrode adjacent the drift region 11 and dielectrically insulated from the drift region 11 by the field electrode dielectric 32 forms the field electrode 31.

Figure 4:
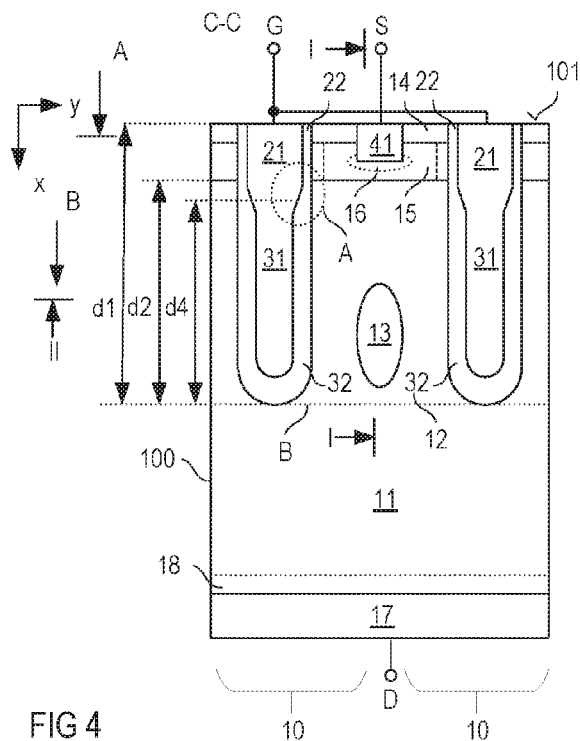
FIG. 4 shows another modification of the transistor device shown in FIG. 1.
Figure 5:
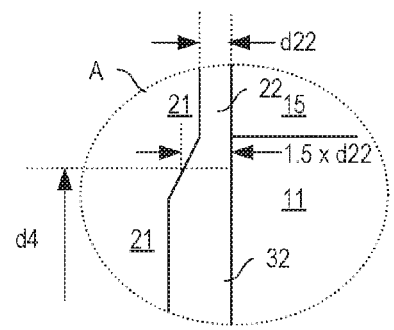
FIG. 5 shows a detail of the transistor device shown in FIG. 4.

FIG. 5 shows a detail A of the transistor device shown in FIG. 4 in a transition region between the gate dielectric 22 and the field electrode dielectric 32. Referring to the above, the field electrode dielectric 32 is thicker than the gate dielectric 22 so that, beginning at the gate dielectric 22, a thickness of a dielectric layer forming the gate dielectric 21 and the field electrode dielectric 32 increases. In FIGS. 4 and 5, d4 denotes a distance between a position where a thickness of the dielectric layer corresponds to 1.5 times a thickness d22 of the gate dielectric 22. This thickness d22 may be the average thickness of the gate dielectric 22 along the body region 15, the maximum thickness of the gate dielectric 22 along the body region 15, or a thickness of the gate dielectric 22 in the middle of the body region 15 between the source region 14 and the drift region 11. According to one embodiment, a distance between at least one section of the avalanche region 13 and the bottom plane B is less than 50% of d4, less than 30% of d4, less than 20% of d4, or even less than 10% of d4. According to one embodiment, a distance between each section of the avalanche region 13 and the bottom plane B is less than 50% of d4, less than 30% of d4, less than 20% of d4, or even less than 10% of d4.

Figure 6:
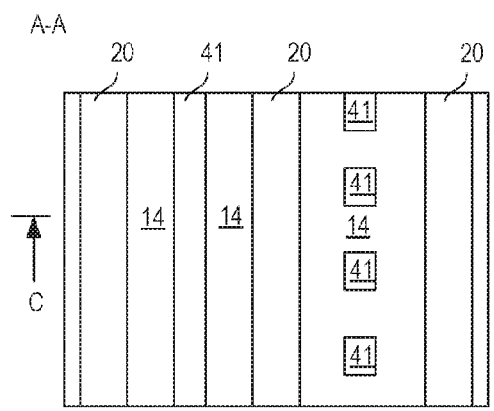
FIG. 6 shows a horizontal cross sectional view in a first section plane of a transistor device of one of the types shown in FIGS. 1, 3 and 4 according to one embodiment.

FIG. 6 shows a horizontal cross sectional view of a transistor device of the type shown in FIG. 1, according to one embodiment. FIG. 6 shows a cross section in a section plane A-A going through the source region 14. In this embodiment, the gate electrodes of the plurality of transistor cells are elongated electrodes that are substantially parallel to each other. In FIG. 6, reference character 20 denotes gate structures which include the gate electrode (21 in FIGS. 1, 3 4) and the gate dielectric (22 in FIGS. 1, 3 and 4). The source electrodes 41 may be implemented as elongated electrodes in the horizontal plane, as shown on the left side in FIG. 6. Alternatively, between two gate structures 20 there is a plurality of spaced apart source electrodes 41, as shown on the right side in FIG. 6.

Figure 7:
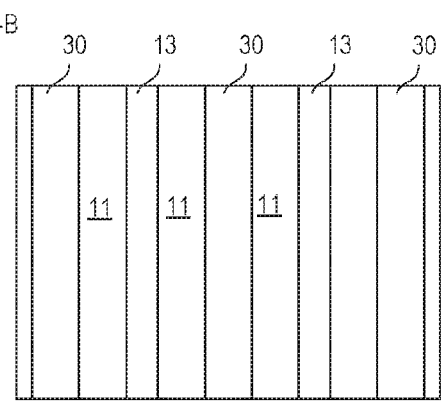
FIG. 7 shows a horizontal cross sectional view in a second section plane of a transistor device of one of the types shown in FIGS. 1, 3 and 4 according to one embodiment.

FIG. 7 shows a horizontal cross sectional view of a transistor device of the type shown in FIG. 1, according to one embodiment. FIG. 7 shows the horizontal cross sectional view in a section plane B-B going through the field electrodes of the plurality of transistor cells and the avalanche regions 13. In FIG. 7 reference character 30 denotes field electrode structures, with each of these field electrode structures including a field electrode (31 in FIGS. 1, 3 and 4) and the field electrode dielectric (32 in FIGS. 1, 3 and 4). Referring to FIG. 7, the field electrode structures 30 can be elongated structures in the horizontal plane, whereas two neighboring field electrode structures 30 define the semiconductor mesa region 12 in which the avalanche region 13 is arranged. In the embodiment shown in FIG. 7, the avalanche region 13 is an elongated region with regions which extend substantially parallel to the field electrode structures 30.

Figure 8:
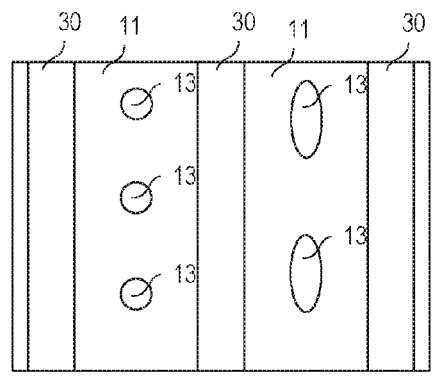
FIG. 8 shows a modification of the transistor device shown in FIG. 7.

According to another embodiment, shown in FIG. 8, the mesa region between two elongated field electrode structures 30 includes a plurality of avalanche regions 13. These avalanche regions 13 are spaced apart in a direction corresponding to a longitudinal direction of the elongated field electrode structures 30. In the horizontal plane, the avalanche regions 13 may have a substantially circular shape as shown on the left side in FIG. 8, an elliptical shape, as shown on the right side in FIG. 8 or the like.

Figure 9:
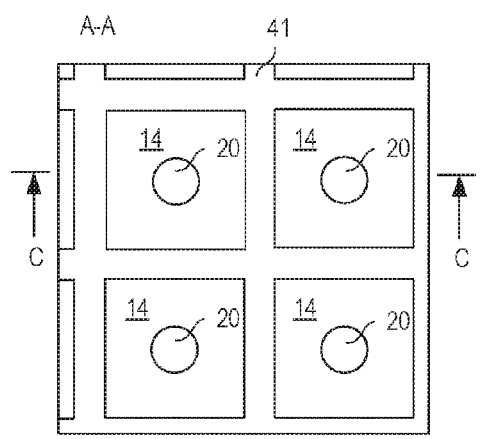
FIG. 9 shows a horizontal cross sectional view in the first section plane of a transistor device of one of the types shown in FIGS. 1, 3 and 4 according to another embodiment.

FIG. 9 shows a horizontal cross sectional view of a transistor device of the type shown in FIG. 1, according to another embodiment. In this embodiment, the gate structures 20 are pile shaped (needle shaped). The source electrode 41 defines a grid, whereas the source regions 14 and the body regions 15 (out of view in FIG. 9) and the gate structures 20 are arranged in openings of this grid defined by the source electrode 41.

Figure 10:
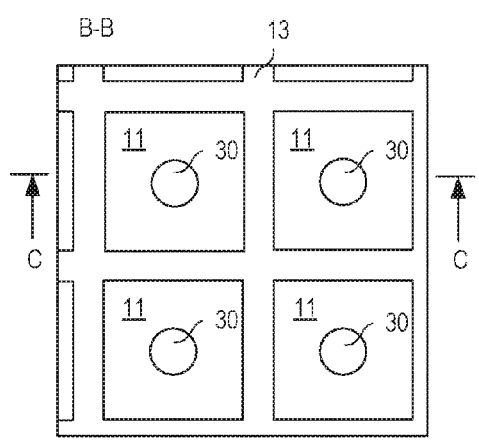
FIG. 10 shows a horizontal cross sectional view in the second section plane of a transistor device of one of the types shown in FIGS. 1, 3 and 4 according to another embodiment.

FIG. 10 shows a horizontal cross sectional view of the transistor device shown in FIG. 9 in section plane B-B shown in FIG. 1. In this embodiment, the field electrode structures 30, like the gate electrode structures shown in FIG. 9, are pile shaped (needle shaped). Furthermore, the avalanche region 13 has the form of a grid. In context with the shape (form) of the field electrode structures 30, "needle shaped" means that a dimension of the field electrode structure 30 in the vertical direction of the semiconductor body 100 is larger than the dimension of the field electrode structure 30 in each of the horizontal (lateral) directions. According to one embodiment, the vertical dimension is at least 2 times, 5 times, or even 10 times the largest lateral dimension of the needle-shaped field electrode structures 30.

Figures 11, 12:
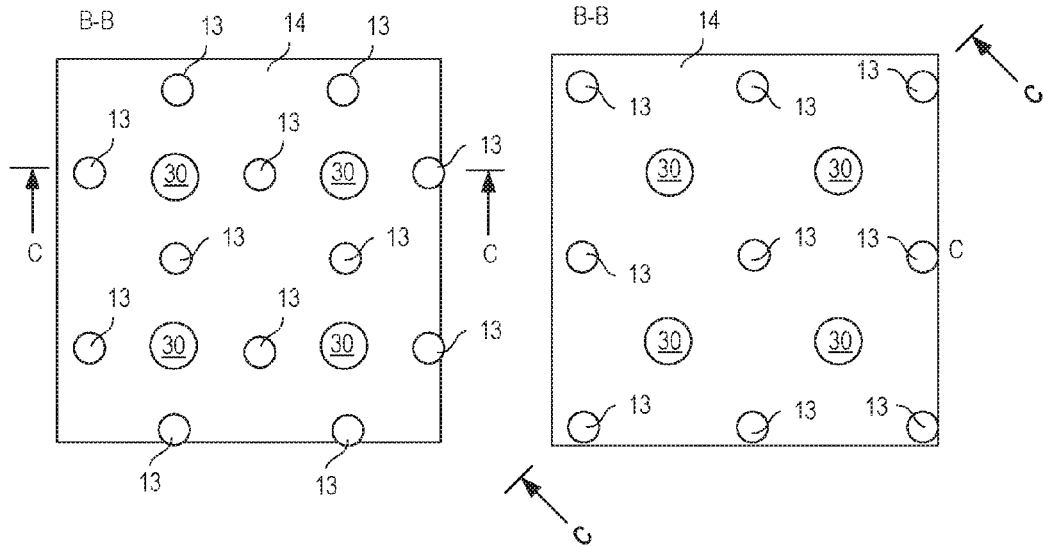
FIGS. 11-13 show horizontal cross sectional views in the second section plane of transistor devices of one of the types shown in FIGS. 1, 3 and 4 according to further embodiments.

FIG. 11 shows a modification of the transistor device shown in FIG. 10. In this embodiment, there is a plurality of avalanche regions 13. These avalanche regions 13 are spaced apart from each other and spaced apart from the needle shaped field electrode structures 30. In the embodiment shown in FIG. 11, one avalanche region 13 is substantially in the middle between two neighboring field electrode structures 30. The gate structures 20 and the source electrode 41 (not shown in FIG. 11) may be implemented as explained with reference to FIG. 9. Alternatively, the source electrode 41 includes a plurality of needle shaped electrodes above the avalanche regions 13, instead of having a grid shape as shown in FIG. 9.

FIG. 12 shows a modification of the embodiment shown in FIG. 11. In the embodiment shown in FIG. 12, one avalanche region 13 is arranged substantially in the middle between four neighboring field electrode structures 30. The gate structures 20 and the source electrode 41 (not shown in FIG. 12) may be implemented as explained with reference to FIG. 11.

Figure 13:
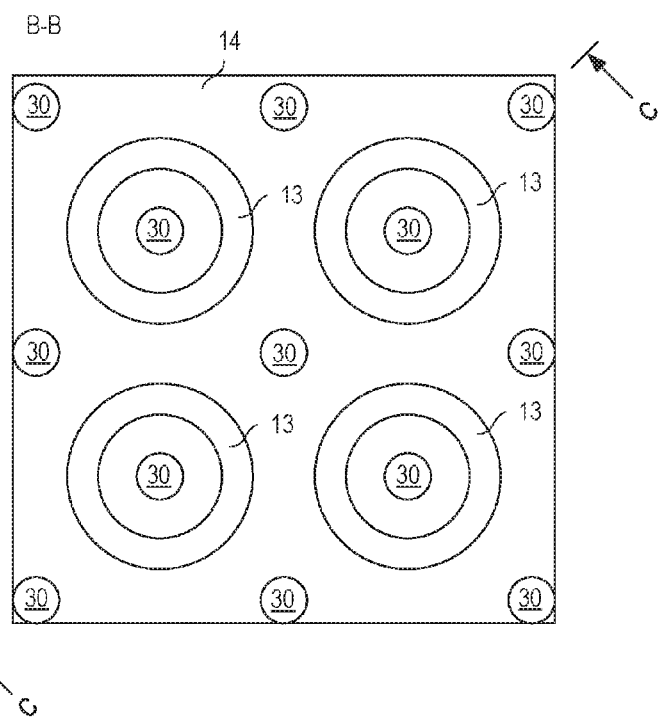

FIG. 13 shows another embodiment of a transistor device with pile shaped field electrode structures 30. In this embodiment, the field electrode structures 30 are arranged such that one field electrode structures 30 is substantially in the middle between four neighboring field electrode structures and is surrounded by a ring shaped avalanche region 13. The gate structures 20 (not shown in FIG. 13) may be implemented with a needle shape, as shown in FIG. 9. The source electrode 41 (not shown in FIG. 13) may have the form of the avalanche regions and may be arranged above the avalanche regions 13, as shown in FIGS. 1, 3 and 4.

FIG. 14 shows a vertical cross sectional view of a transistor device according to another embodiment. This transistor device is different from the transistor devices shown in FIGS. 1, 3 and 4 in that the gate electrode 21 and the field electrode 31 of one transistor cell 10 are not arranged in the same trench, but are arranged in different trenches. In this embodiment, two or more transistor cells may share one gate electrode 21. In this embodiment, the trench with the gate electrode 21 is arranged between the trenches with the field electrodes 31 of two neighboring transistor cells. Each transistor cell 10 may include one source electrode 41 electrically connected to the source region 14 and the body region 15. This source electrode 41 of one transistor cell 10 may be located in a trench extending from the first surface 101 of the semiconductor body through the source region 14 into the body region 15 and being arranged between the trench with the field electrode structure 31, 32 and the trench with the gate structure 21, 22.

Referring to FIG. 14, an avalanche region 13 is arranged in the drift region 11 such that it is spaced apart from the pn junction between the body region 15 and the drift region 11 in the current flow direction (which is the vertical direction of the semiconductor body 100 in the embodiment shown in FIG. 14) and from the field electrode dielectric 32 in a direction perpendicular to the current flow direction (which is a horizontal direction of the semiconductor body 100 in the embodiment shown in FIG. 14). In the current flow direction, like in the embodiments shown in FIGS. 1, 3 and 4, the avalanche region 13 is substantially above a bottom region of the trench including the field electrode 31 and the field electrode dielectric 32. That is, in the current flow direction, the avalanche region 13 is in the mesa region 12 and does not extend beyond the bottom of this trench in the direction of the drain region 17.

Referring to FIG. 14, the avalanche region 13 may be located below the trench with the gate electrode 21. In this embodiment, two neighboring transistor cells 10 share one avalanche region 13. Additionally or alternatively, the avalanche region 13 of one transistor cell 10 is located below the trench including the source electrode 41.

The avalanche region 13 may by positioned in the mesa region 12 between the trenches with the field electrodes 31 in the way outlined above. That is, at least one section or the overall avalanche region 13, may be located closer to the bottom plane B than to the first surface 101, the pn junction, or the gate electrode 21, respectively.

FIG. 15 shows a horizontal cross sectional view of a transistor device of the type shown in FIG. 14, according to one embodiment. FIG. 15 shows a horizontal cross sectional view in section plane D-D shown in FIG. 14, with this section plane D-D going through the source regions 14 of the transistor cells 10. In the embodiment shown in FIG. 15, the field electrode structures 30 and the gate structures 20 of the individual transistor cells are elongated structures that are substantially parallel. The source electrodes 41 may be elongated electrodes extending substantially parallel to the field electrode structures 30 and the gate electrode structures 20, as shown on the left side in FIG. 14. Alternatively, there are a plurality of spaced apart source electrodes 41 between one gate structure 20 and one field electrode structure 30, as shown on the right side in FIG. 14.

Figure 17:
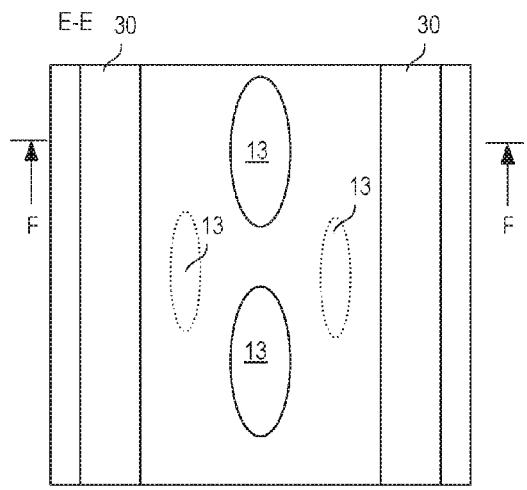
FIG. 17 shows a modification of the transistor device shown in FIG. 16.

FIG. 16 shows a horizontal cross sectional view of a transistor device of the type shown in FIG. 14, according to one embodiment. FIG. 16 shows a horizontal cross sectional view in section plane E-E shown in FIG. 14. This section plane E-E goes through the field electrode structures 30 and the avalanche regions 13. In the embodiment shown in FIG. 16, the field electrode structures 30 are elongated structures, and the avalanche regions 13 are elongated structures extending substantially parallel to the field electrode structures 30. Alternatively, as shown in FIG. 17, the transistor device may include a plurality of spaced apart avalanche regions 13 between two neighboring elongated field electrode structures 30.

Figure 18:
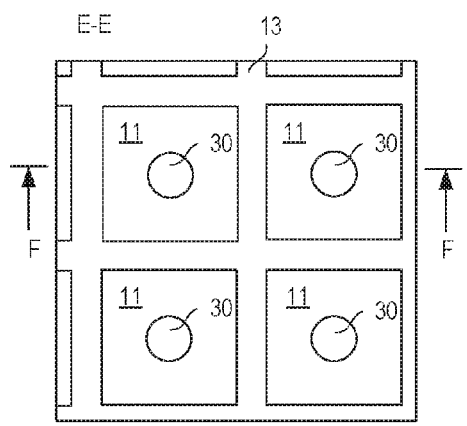
FIG. 18 shows a horizontal cross sectional view in the second section plane of a transistor device of the type shown in FIG. 14, according to another embodiment.
Figure 19:
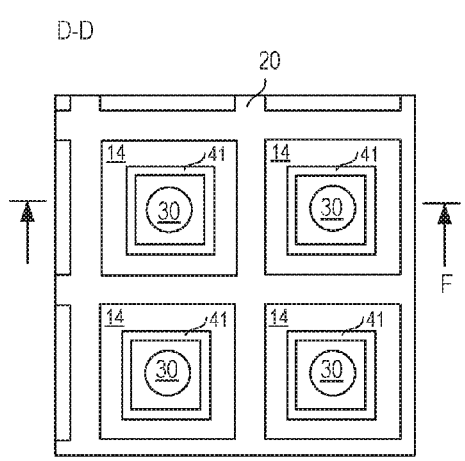
FIG. 19 shows a horizontal cross sectional view in the first section plane of the transistor device shown in FIG. 18.

FIG. 18 shows a horizontal cross sectional view of a transistor device of the type shown in FIG. 14, according to another embodiment. FIG. 18 shows a horizontal cross sectional view in section plane E-E shown in FIG. 14. In this embodiment, the field electrode structures 30 are needle shaped, and the avalanche region 13 has the shape of a grid. This structure corresponds to the structure explained with reference to FIG. 10. In the transistor device shown in FIG. 18, the gate structure (not shown in FIG. 18) may be located above the avalanche region 13 as shown in FIG. 14. The gate structure may have a grid shape. A horizontal cross sectional view of a transistor device in section plane D-D with a grid-shaped gate structure 20 is shown in FIG. 19. The source electrodes 41 may surround the field electrode structures 30, as shown in FIG. 19. According to another embodiment, each transistor cell includes one or more needle shaped source electrodes 41.

Figure 20:
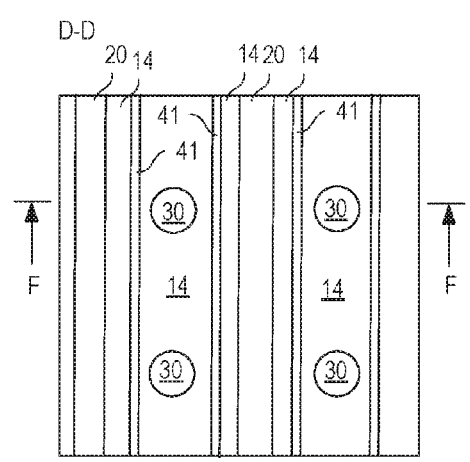
FIG. 20 shows a horizontal cross sectional view in a first section plane of a transistor device of the type shown in FIG. 14, according to one embodiment.

FIG. 20 shows a horizontal cross sectional view in the first section plane D-D of a transistor device with needle shaped field electrode structures 30 according to another embodiment. In this embodiment, the gate structure 20 is an elongated structure. That is a dimension of the gate structure 20 in a first lateral direction of the semiconductor body 100 is much larger than the dimension in a second lateral direction (which may be perpendicular to the first direction). Like the gate structure 20, the source electrode 41 is an elongated structure in the embodiment shown in FIG. 20. However, this is only an example; according to another embodiment (not shown) the source electrode 41 includes a plurality of needle shaped electrode sections.

Figure 21:
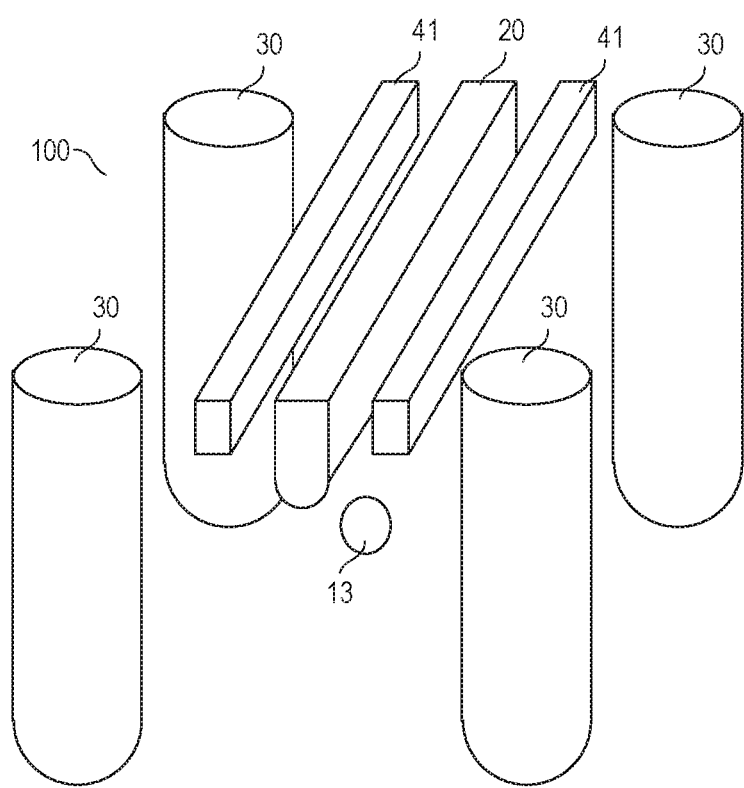
FIG. 21 shows a perspective view of a transistor device of the type shown in FIG. 20.

FIG. 21 shows a perspective view of the transistor device shown in FIG. 20. In FIG. 21, the semiconductor body 100 is drawn transparent so as to illustrate the shape and the position of the needle shaped field electrode structures 30 (from which only four are shown), the elongated gate structures 20 (from which only one is shown), and the elongated source electrodes 41 (from which only two are shown). In the embodiment shown in FIG. 21, one avalanche region 13 spaced apart from the four field electrode structures is shown. However, this is only an example; according to another embodiment, there is a grid-shaped avalanche region 13, as shown in FIG. 18. Further embodiments of how the avalanche region 13 can be implemented in a transistor device with needle-shaped field electrode structures 30 are shown in FIGS. 22-24 and explained below.

Figures 22, 23:
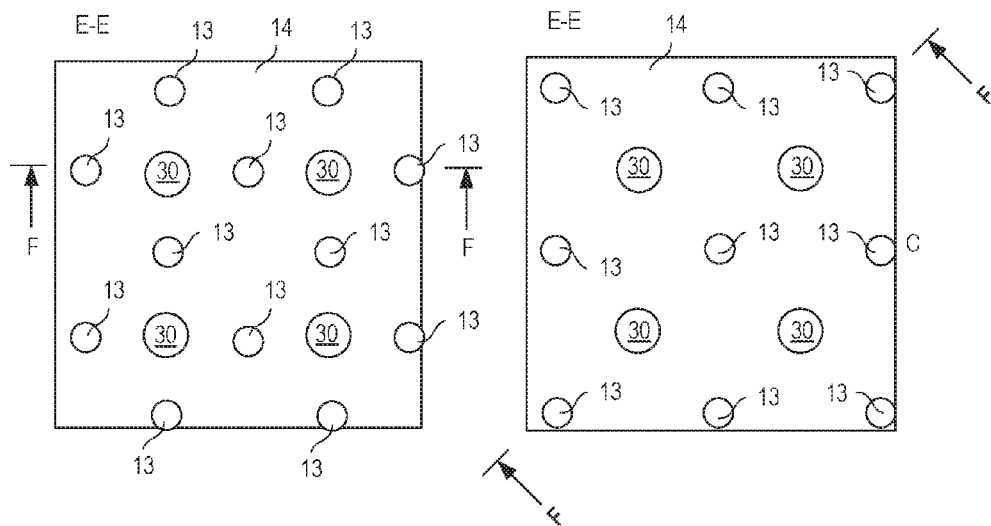
FIGS. 22-24 show horizontal cross sectional views in the second section plane of transistor devices of the type shown in FIG. 14, according to further embodiments.
Figure 24:
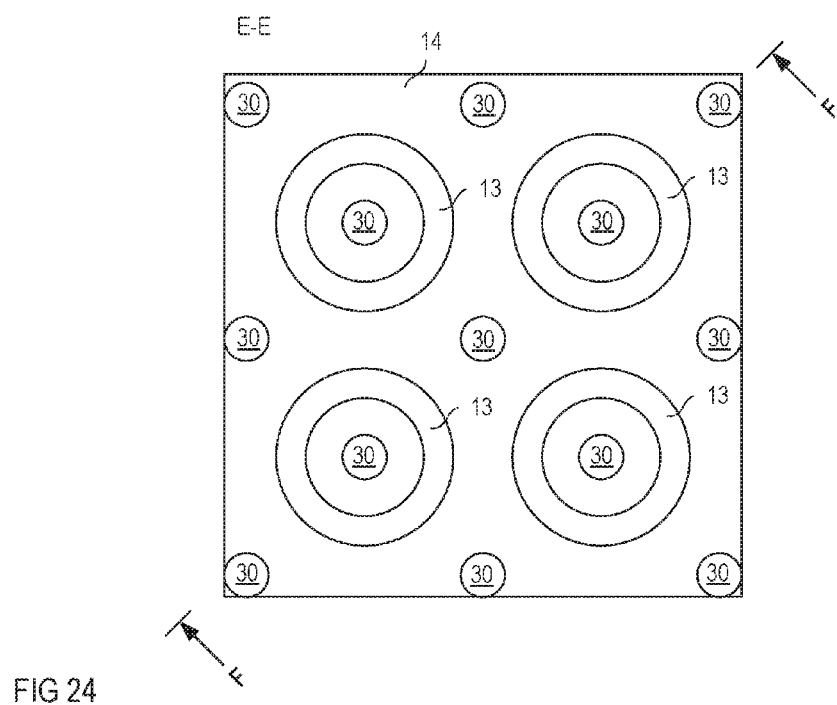

FIGS. 22-24 show vertical cross sectional views of a transistor device of the type shown in FIG. 14 or the type shown in FIG. 21 in the second section plane E-E. According to these embodiments, the field electrode structures 30 are implemented to have a needle shape, whereas several spaced apart avalanche regions 13 are arranged between these needle shaped field electrode structures 30 in the drift region 11. The embodiments shown in FIGS. 22 and 23 correspond to the embodiments shown in FIGS. 11 and 12. In the transistor devices shown in FIGS. 22 and 23, the gate structure (not shown in FIGS. 22 and 23) can be implemented with a grid shape as shown in FIG. 19. Alternatively, the transistor devices may include a plurality of needle shaped gate structures, where these gate structures may be located above the individual avalanche regions 13, as shown in FIG. 14.

According to another embodiment shown in FIG. 24, the field electrode structures 30 may be needle shaped, wherein several of these field electrode structures are surrounded by an avalanche region 13. This is in correspondence with the embodiment shown in FIG. 13, to which reference is made. In the transistor device shown in FIG. 24, the gate structure (not shown in FIG. 24) may be implemented as shown in FIG. 19. According to another embodiment, the transistor device includes several gate electrodes having a shape, in the horizontal plane, corresponding to the shape of the avalanche regions 13 and being located above the avalanche regions 13, as shown in FIG. 14.

Figure 25A:
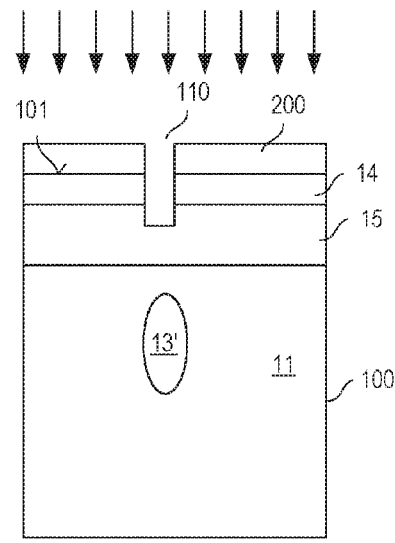
FIGS. 25A-25B illustrate one embodiment of a method for producing an avalanche region in a drift region of a transistor device.
Figure 25B:
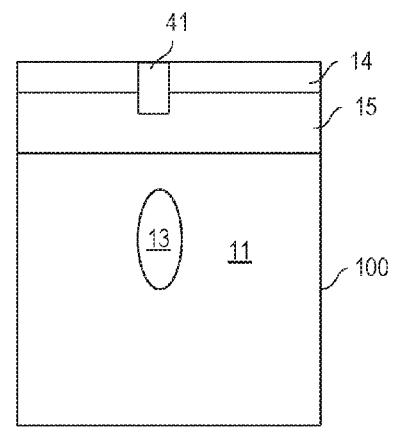

FIGS. 25A-25B show one embodiment of a method for producing the at least one avalanche region 13. Referring to FIG. 25A, the method includes forming a trench 110 in the first surface 101 of the semiconductor body 100. Etching the trench 110 may include a conventional etching process such as, for example, an anisotropic etching process using an etch mask 200. The method further includes implanting particles via a bottom of the trench 110 into the drift region 11, so as to form an implanted region 13'. The implanted region 13' includes the particles implanted in the implantation process. The implantation process may include several implantation steps at different implantation energies so as to implant particles into different vertical positions of the semiconductor body 100. In order to prevent particles from being implanted into the first surface 101 the implantation process includes using an implantation mask that covers the first surface 101, but uncovers the trench 110. According to one embodiment, the etch mask 200 used for etching the trench 110 is also used as the implantation mask in the implantation process.

According to one embodiment, the implanted particles are dopant atoms of the first type. If the first type is an n-type, those particles are boron (B) ions or aluminum (Al) ions, for example.

Forming the avalanche region 13 further includes an annealing process in which the implanted dopant atoms are electrically activated. Such annealing process can be performed directly after implanting the particles, or at a later stage in the manufacturing process of the semiconductor device. For example, the temperatures in this annealing process are between 900° C. and 1100° C. The annealing process can be an RTA (Rapid Thermal Annealing) process lasting between several seconds and several minutes, or a conventional annealing (tempering) process lasting longer.

In the embodiment shown in FIG. 25A, the body region 15 and a source region 14 have already been formed before the particles are implanted. However, this is only an example. According to another embodiment, the body region 15 and the source region 14 is formed after the particles have been implanted. Forming the source region and the body region 14, 15 may include an implantation process. According to another embodiment, dopant atoms for forming the body region 15 and the source region 14 have been implanted before implanting the particles that form the implanted region 13', and the dopant atoms to form the source region 14, the body region 15 and the avalanche region 13 are activated in a common annealing process.

Referring to FIG. 25B, the method further includes forming the source electrode 41 in the trench 110. Forming the source electrode 41 may include filling the trench with one of the electrode materials explained herein above.

Figure 26A:
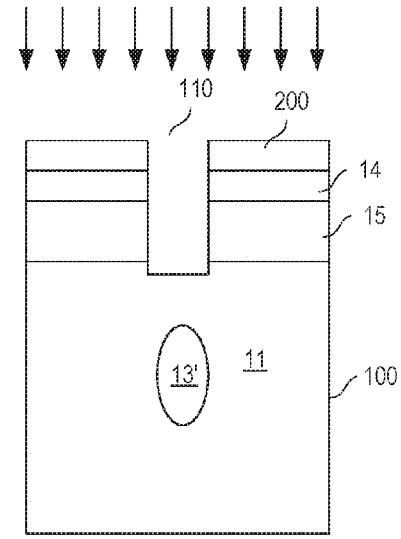
FIGS. 26A-26B illustrate another embodiment of a method for producing an avalanche region in a drift region of a transistor device.
Figure 26B:
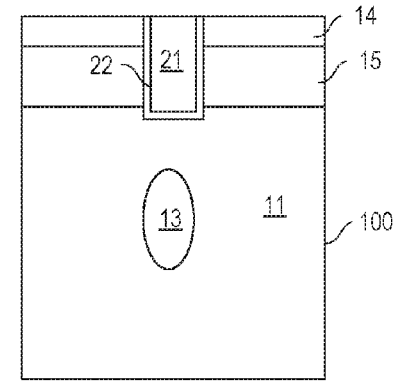

FIGS. 26A-26B show another embodiment of a method for producing the avalanche region 13. The method shown in FIGS. 26A-26B is different from the method shown in FIGS. 25A-25B in that, after implanting the particles, the gate dielectric 22 and the gate electrode 21 is formed in the trench 110. Forming the gate dielectric may include one of an oxidation process and a deposition process. Forming the gate electrode 21 may include filling the residual trench with one of the electrode materials explained herein above.

Figure 27A:
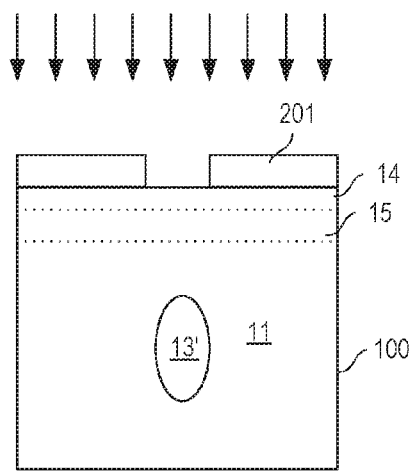
FIGS. 27A-27B illustrate another embodiment of a method for producing an avalanche region in a drift region of a transistor device.
Figure 27B:
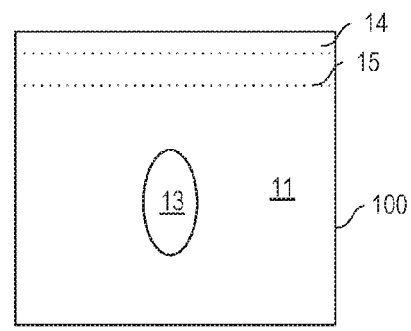

FIGS. 27A-27B show another embodiment of a method for producing the avalanche region 13. In this embodiment, the avalanche region 13 is formed, or at least dopant atoms forming the avalanche region 13 in the finished device are introduced, after the drift region 11 was formed. Forming the drift region 11 may include an epitaxial process in which an epitaxial layer is grown on a substrate (not shown). Referring to FIG. 27A, the method includes implanting dopant atoms into the drift region 11 using an implantation mask 201 to form an implanted region 13'. In next process steps, the result of which is shown in FIG. 27B, at least the implanted region 13' is annealed so as to form the avalanche region 13.

In next process steps the body region 15 and the source region 14 may be formed, so as to obtain a device structure with a drift region 11, a body region 15 and a source region 14 as explained before. Forming the body region 15 and the source region may include at least one epitaxial process in which epitaxial layers forming the body region 15 and the source region 14 in the finished device are grown on the drift region. According to another embodiment, the body region 15 and the source region 14 are formed in the drift region 11 by implanting dopant atoms and activating the implanted dopant atoms. According to yet another embodiment, an epitaxial layer having the doping type and doping concentration of the body region 15 is grown on the drift region 11, and the source region 14 is formed in this epitaxial layer by implanting dopant atoms and activating the implanted dopant atoms.

If, in the method illustrated in FIGS. 27A and 27B, forming the body region 15 and the source region 14 includes an implantation and annealing (activating) process. One common annealing process may be used to activate the dopant atoms in the avalanche region 13 as well as the dopant atoms in the body region 15 and the source region 14.

According to yet another embodiment of a method for forming the avalanche region 13, the implanted region 13' is formed after the body region 15 and the source region 14 have been formed, but before trenches accommodating the gate electrode 21 and/or the source electrodes 41 have been formed. This method is a modification of the method shown in FIGS. 27A-27B where the source region 14 and the body region 15 are illustrated in dotted lines.

Other structures of the transistor device, such as the field electrode structure 30, are not shown in FIGS. 25A-25B and 26A-26B. These field electrode structures 30 can be produced a conventionally known manner.

When the semiconductor body 100 is made of silicon, alternatively to implanting dopant atoms (dopant ions) to form the implanted regions 13' shown in FIGS. 25A and 26A, the method may include implanting non-doping particles, such as protons or helium ions. Those implanted non-doping particles cause defects in the implanted region 13', whereas in a subsequent annealing process irradiation-induced defects are formed that act like donors. In case of an irradiation with protons, those donors can be referred to as hydrogen induced donors or hydrogen-related shallow thermal donors. In case of an irradiation with helium ions, those donors can be referred to as thermal double donors. The annealing process includes temperatures of between 380° C. and 500° C. in particular, temperatures between 380° C. and 450° C. A duration of the annealing process is, for example, between 30 minutes and 2 hours.

The forming of thermal double donors, besides the irradiation with helium ions, requires oxygen. Such oxygen can be left in the semiconductor body 100 from the manufacturing process when the semiconductor body 100 is a piece of silicon obtained from a Czochralski (CZ) wafer. However, oxygen is also introduced into the semiconductor body 100 in oxidation processes, such as oxidation processes for forming one of the gate dielectric 22 and the field electrode dielectric 32.

The avalanche region 13 may include irradiation induced donors in those embodiments in which the drift region 11 is an n-type drift region. At higher temperatures those donor-like defects dissipate. Thus, according to one embodiment, the avalanche region 13 is produced at a time in the manufacturing process when no temperature processes involving temperatures of higher 500° C. or higher 550° C. occur.

Different from a doping process in which dopant atoms are implanted, in an irradiation induced doping process donors, that is complexes acting like donors, are only generated in those regions into which the non-doping particles are implanted. Thus, there is no "diffusion" of those donors into not implanted regions. Thus, the dimension of the avalanche region 13 in a direction perpendicular to the direction in which the protons are implanted can be precisely defined by the implantation mask. In particular, a distance between the avalanche region 13 and the field electrode dielectric can be defined precisely.

Forming the avalanche region 13 may include several implantation processes at different implantation energies so as to implant the dopant atoms or the non-doping particles into different vertical positions of the semiconductor body. By this, the shape of the avalanche region 13 in the current flow direction (the vertical direction) can be defined.

Helium ions are heavier than protons so that implanting helium ions into a certain vertical position of the semiconductor body requires higher implantation energies than implanting protons into the same position. As protons, at a given implantation energy, are implanted deeper than helium ions or conventional doping atoms, protons are suitable for producing avalanche regions 13 deep in the semiconductor body.

According to another embodiment, in a method where dopant atoms are implanted to form the avalanche region 13, there are at least two implantation processes and at least two annealing processes. In the annealing process, the implanted dopant atoms diffuse in the semiconductor body, whereas the extent of such diffusion increases as the duration and/or the temperature of the annealing process increases. Thus, by suitably selecting the parameters of the annealing process the dimension of the avalanche region 13 in the horizontal direction (that is, the direction perpendicular to the current flow direction) can be adjusted. According to one embodiment, forming the avalanche region 13 includes a first implantation process followed by a first annealing process and at least one second implantation process followed by a second annealing process.

According to yet another embodiment, several implantation masks are used to implement dopant atoms or non-doping particles at different horizontal positions into the mesa region 12. This helps further to define the shape of the avalanche region.

In a process that uses several implantation processes the same type of dopants can be used in the individual implantation processes. According to another embodiment, at least two different types of dopants are used. According to yet another embodiment, forming the avalanche region 13 includes at least a first implantation process that implants dopants followed by at least one annealing process to activate the dopants, and at least one second implantation process that implants non-doping particles, such as protons, followed by a second annealing process that causes the formation of donor-like complexes.

By the methods explained above, an avalanche region 13 can be formed that has shape selected from a variety of different shapes. Examples of those shapes, in the plane extending in the current flow direction (the vertical plane in the embodiments shown in FIGS. 1, 3, 4 and 14 include an elliptical shape (as shown), a triangular shape with rounded corners, or the like.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A transistor device comprising at least one transistor cell, wherein the at least one transistor cell comprises:
   in a semiconductor body, a drift region of a first doping type, a source region of the first doping type, a body region of a second doping type, and a drain region of the first doping type, wherein the body region is arranged between the source region and the drift region, and wherein the drift region is arranged between the body region and the drain region;
   a gate electrode adjacent the body region and dielectrically insulated from the body region by a gate dielectric; and
   a field electrode dielectrically insulated from the drift region by a field electrode dielectric;
   wherein the drift region comprises an avalanche region which has a higher doping concentration than sections of the drift region adjacent the avalanche region and is spaced apart from the field electrode dielectric in a direction perpendicular to a current flow direction of the transistor device,
   wherein the field electrode is arranged in a trench having a bottom in a bottom plane of the semiconductor body, wherein the avalanche region includes at least one section that is closer to the bottom plane than to a surface of the semiconductor body defined by the source region, wherein the avalanche region is spaced apart from a pn junction between the body region and the drift region in the current flow direction of the transistor device.

2. The transistor device of claim 1, wherein the trench is a needle-shaped trench, and wherein a vertical dimension of the needle-shaped trench is at least 2 times a maximum lateral dimension of the needle-shaped trench.

3. The transistor device of claim 1, wherein each section of the avalanche region is closer to the bottom plane than to the surface of the semiconductor body defined by the source region.

4. The transistor device of claim 1, wherein a distance between at least one section of the avalanche region and the bottom plane is less than 30% of a distance between the bottom plane and the surface of the semiconductor body defined by the source region.

5. The transistor device of claim 1, wherein a distance between at least one section of the avalanche region and the bottom is less than 50% of a distance between the bottom plane and the gate electrode.

6. The transistor device of claim 1, wherein the bottom plane is spaced apart from the pn junction.

7. The transistor device of claim 1, wherein a ratio between a maximum doping concentration of the avalanche region and a doping concentration of those sections of the drift region adjacent the avalanche region is between 2 and 10.

8. The transistor device of claim 6, wherein a ratio between a maximum doping concentration of the avalanche region and a doping concentration of those sections of the drift region adjacent the avalanche region is between 4 and 7.

9. The transistor device of claim 1, wherein the current flow direction of the transistor device is a vertical direction of the semiconductor body.

10. The transistor device of claim 1, wherein the gate electrode and the field electrode are arranged in a first trench of the semiconductor body.

11. The transistor device of claim 10, further comprising:
a source electrode arranged in a second trench spaced apart from the first trench and electrically connected to the source region and the body region,
wherein the avalanche region is arranged below the second trench in the current flow direction of the transistor device.

12. The transistor device of claim 1, wherein the field electrode is arranged in a first trench of the semiconductor body and the gate electrode is arranged in a second trench spaced apart from the first trench.

13. The transistor device of claim 12, wherein the avalanche region is arranged below the second trench in the current flow direction of the transistor device.

14. The transistor device of claim 12, further comprising:
a source electrode arranged in a third trench spaced apart from the first trench and electrically connected to the source region and the body region,
wherein the avalanche region is arranged below the third trench in the current flow direction of the transistor device.

15. The transistor device of claim 1, wherein the transistor device comprises a plurality of transistor cells.

16. The transistor device of claim 1, wherein the gate electrode and the field electrode are dielectrically insulated from one another.

17. The transistor device of claim 1, wherein the gate electrode and the field electrode are electrically connected.

18. A transistor device comprising at least one transistor cell, wherein the at least one transistor cell comprises:
in a semiconductor body, a drift region of a first doping type, a source region of the first doping type, a body region of a second doping type, and a drain region of the first doping type, wherein the body region is arranged between the source region and the drift region, and wherein the drift region is arranged between the body region and the drain region;
a gate electrode arranged in a first trench in the semiconductor body and dielectrically insulated from the body region by a gate dielectric;
a field electrode arranged in the first trench and dielectrically insulated from the drift region by a field electrode dielectric;
a source electrode arranged in a second trench spaced apart from the first trench and electrically connected to the source region and the body region,
wherein the drift region comprises an avalanche region which has a higher doping concentration than sections of the drift region adjacent the avalanche region and is spaced apart from the field electrode dielectric in a direction perpendicular to a current flow direction of the transistor device,
wherein the avalanche region is arranged below the second trench in the current flow direction of the transistor device.

19. The transistor device of claim 18, wherein the first trench has a bottom in a bottom plane of the semiconductor body, wherein the avalanche region includes at least one section that is closer to the bottom plane than to a surface of the semiconductor body defined by the source region, and wherein the avalanche region is spaced apart from a pn junction between the body region and the drift region in the current flow direction of the transistor device.

20. A transistor device comprising at least one transistor cell, wherein the at least one transistor cell comprises:
in a semiconductor body, a drift region of a first doping type, a source region of the first doping type, a body region of a second doping type, and a drain region of the first doping type, wherein the body region is arranged between the source region and the drift region, and wherein the drift region is arranged between the body region and the drain region;
a gate electrode arranged in a first trench in the semiconductor body and dielectrically insulated from the body region by a gate dielectric;
a field electrode arranged in a second trench spaced apart from the first trench and dielectrically insulated from the drift region by a field electrode dielectric; and
a source electrode arranged in a third trench spaced apart from the first trench and electrically connected to the source region and the body region,
wherein the drift region comprises an avalanche region which has a higher doping concentration than sections of the drift region adjacent the avalanche region and is spaced apart from the field electrode dielectric in a direction perpendicular to a current flow direction of the transistor device,
wherein the avalanche region is arranged below the third trench in the current flow direction of the transistor device.

21. The transistor device of claim 20, wherein the second trench has a bottom in a bottom plane of the semiconductor body, wherein the avalanche region includes at least one section that is closer to the bottom plane than to a surface of the semiconductor body defined by the source region, and wherein the avalanche region is spaced apart from a pn junction between the body region and the drift region in the current flow direction of the transistor device.

* * * * *